United States Patent [19]

Gossard et al.

[11] Patent Number: 4,591,889
[45] Date of Patent: May 27, 1986

[54] SUPERLATTICE GEOMETRY AND DEVICES

[75] Inventors: Arthur C. Gossard, Warren; Pierre M. Petroff, Westfield, both of N.J.

[73] Assignee: AT&T Bell Laboratories, Murray Hill, N.J.

[21] Appl. No.: 651,044

[22] Filed: Sep. 14, 1984

[51] Int. Cl.$^4$ .......................................... H01L 27/12
[52] U.S. Cl. ........................................ 357/4; 357/16; 357/17
[58] Field of Search .................. 357/4, 55, 45 L, 16, 357/17

[56] References Cited

U.S. PATENT DOCUMENTS

| 3,310,439 | 3/1967 | Seney | 357/4 X |
| 4,050,964 | 9/1977 | Rode | 357/16 X |
| 4,137,542 | 1/1979 | Chang et al. | 357/16 OR |
| 4,205,329 | 5/1980 | Dingle et al. | 357/4 X |
| 4,503,447 | 3/1985 | Iafrate et al. | 357/4 X |

Primary Examiner—Martin H. Edlow
Assistant Examiner—S. Crane
Attorney, Agent, or Firm—Richard D. Laumann

[57] ABSTRACT

Semiconductor devices having submonolayer superlattices are described. These devices may have periodic compositional variations in a direction parallel to the substrate surface as well as in the perpendicular direction. Such superlattices are useful in numerous types of devices including lasers, transistors, etc.

22 Claims, 8 Drawing Figures

SUPERLATTICE GEOMETRY AND DEVICES

TECHNICAL FIELD

This invention relates generally to superlattice devices and particularly to such devices comprising layers grown on surfaces misoriented with respect to a major crystallographic plane and having horizontal and vertical periodicities.

BACKGROUND OF THE INVENTION

Improvements in modern semiconductor device technology have taken place in several areas. For example, effort has been devoted toward preparing higher quality silicon, that is, silicon having fewer defects and/or undesired impurities, than was previously available. Additionally, semiconductors other than silicon, for example, Group III-V compound semiconductors such as GaAs, have been investigated for many device applications because they have, for example, carrier mobilities which are higher than those in silicon and offer prospects of devices faster than their silicon analogues. Additionally, many types of devices, such as field effect transistors, avalanche photodetectors and double heterostructure lasers, etc., have been fabricated and their characteristics investigated.

The development of sophisticated epitaxial growth techniques, such as molecular beam epitaxy, has permitted the expedient fabrication of many of these devices. These techniques have also enabled periodic structures having unit cells different from those of the constituent semiconductors to be fabricated. Perhaps the first such structure was proposed by Esaki and Tsu who suggested a structure, now commonly termed a superlattice, which has a periodic compositional variation in the direction parallel to the growth direction, i.e., perpendicular to a major surface of the substrate. This may be termed a "vertical" superlattice as the periodicity is in the direction perpendicular to a major surface of the substrate. See, for example, *IBM Journal of Research and Development,* 14, pp. 61-65, January, 1970. Such a structure has alternating layers with different compositions or different doping densities. For example, it might have altenating GaAs and AlGaAs layers. The proposed structure had interesting and important device applications. For example, Esaki et al predicted that negative differential conductivity might be observed.

Since the pioneering work by Esaki, numerous other periodic structures have been described. For example, superlattice structures have been fabricated with the layers having a wide range of thicknesses. If the layers are sufficiently thin, quantum mechanical effects become evident as the quantization of the carrier energy levels becomes important. For example, Dingle and Henry, in U.S. Pat. No. 3,982,207 issued on Sept. 21, 1976, describe a low current threshold double heterostructure laser in which the active region comprises a superlattice. The superlattice structure particularly described has a plurality of thin wide bandgap layers interleaved with a plurality of thin narrow bandgap layers and lasing occurs at a low current threshold because of the increased density of states at low energies created by the quantum effects.

Other superlattice structures have been described. For example, U.S. Pat. No. 4,163,237 issued on July 31, 1979 to Dingle, Gossard, and Stormer describes a modulation doped device. In one illustrative embodiment, the device has a doped wide bandgap layer adjacent to a nominally undoped, i.e., intrinsic conductivity, low bandgap layer. The conduction band edge of the narrow bandgap layer is lower in energy than the impurity states of the wide bandgap region and, consequently, carriers from the dopant atoms move into the narrow bandgap region. This is desirable for device operation because the carriers are now confined to the narrow bandgap region, which is nominally undoped, while the impurity dopant atoms are in the wide bandgap region. High carrier mobility results as there is no carrier scattering from impurity atoms.

Still other periodic structures have been described. For example, U.S. Pat. No. 4,205,329 issued on May 27, 1980 to Dingle, Gossard, Petroff, and Wiegmann describes superlattice structures in which the superlattice comprises alternating monolayers, that is, a first plurality of monolayers having a first composition, e.g., GaAs, interleaved with a second plurality of monolayers having a second composition, e.g., AlAs. Of course, embodiments are also described in which several monolayers of one composition are grown and interleaved with one or more monolayers of a second composition. Another embodiment has a plurality of AlGaAs layers and Ge layers. The Ge layers formed a columnar structure. The terminology developed to describe their monolayer superlattice is $(A)_m(B)_n$ where A and B represent different semiconductors or the same semiconductor with different doping concentrations and m and n represent the number of monolayers of A and B, respectively. The structure thus comprises m monolayers of A followed by n monolayers of B, etc.

Growth of monolayer superlattices is possible because the layer by layer growth regime is dominant during deposition. Above a critical substrate temperature, the dominant growth regime is characterized by an atomically rough interface. However, for substrate temperatures within a range below this regime, a laminar growth mode may be achieved and results in atomically smooth interfaces with an abruptness equal to one atomic layer. At deposition temperatures below this range, a mixture of laminar and island growth occurs and yields a rough interface between the, for example, AlAs and GaAs, epitaxial films. The rough interface is thought to arise from competition between layer nucleation on flat step ledges and nucleation at step edges. In other words, a rough interface arises because a fraction of a layer grows on already deposited material, i.e., material equivalent to a monolayer is deposited but the coverage is not uniform. The nucleation of islands is promoted by the presence of impurities on the flat step ledges. This, in turn, will favor the layer growth mechanism, as opposed to islands, over a wider temperature range for the growth.

SUMMARY OF THE INVENTION

Devices having superlattices comprising a plurality of regions with horizontal periodicity and grown on surfaces having a plurality of step edges are described. The term "horizontal periodicity" means that the periodicity is in a direction substantially parallel to the substrate surface. The superlattice may be described as comprising $(A)_m(B)_n$ where A and B are the compositions of the first and second regions, respectively, and m and n are fractions or integer numbers of monolayers formed by A and B, respectively. The step edges, which desirably form a periodic array, are expediently formed by misorienting the surface with respect to a major crystallographic plane. In one embodiment, the superlattice regions comprise alternating regions of two semiconductors, such as GaAs and AlAs, i.e., the superlattice comprises $(GaAs)_m(AlAs)_n$ with m and n being the fractions of the ledges covered by the regions, i.e., the number of monolayers of GaAs and AlAs, respectively. Either or both m and n may be less than or equal to 1.0. Additionally, m and n may both be greater than 1.0. In another embodiment, m or n is less than or equal to 1.0, m+n is greater than 1.0. In a particular embodiment, the surface comprises a misoriented (100) GaAs substrate.

For reasons of clarity, the elements of the devices are not drawn to scale.

DETAILED DESCRIPTION

Figure 1:
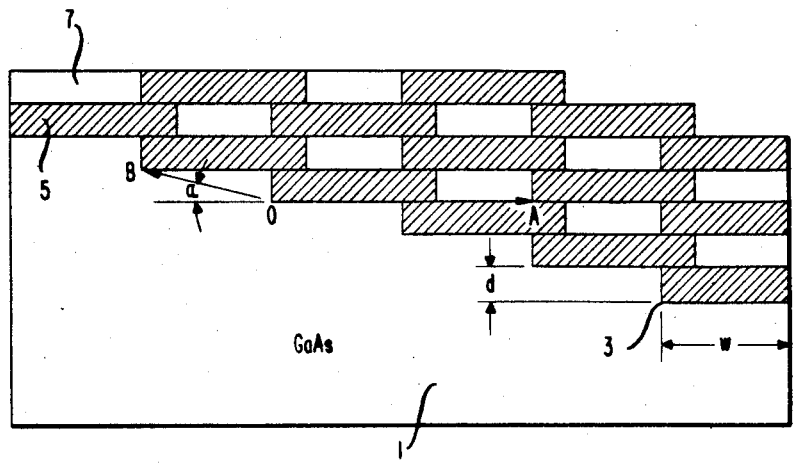
FIG. 1 is a cross-sectional view of one embodiment of a device according to our invention.

A cross-sectional view of one embodiment of a device according to our invention is depicted in FIG. 1. The structure comprises a substrate 1 having a plurality of steps 3 having a height, d, and a width, w. Disposed on substrate 1 are a first plurality of regions 5 comprising a first composition and a second plurality of regions 7 comprising a second composition. The first and second regions are interleaved with each other. The first and second regions on the substrate form a horizontal superlattice. The steps form a periodic array, i.e., the steps are arranged periodically.

The regions typically comprise semiconductors such as Group III-V compound semiconductors. However, other semiconductors and materials that grow epitaxially on the misoriented substrate may also be used. More generally, the first and second regions may be represented as $(A)_m$ and $(B)_n$ where A and B are the first and second compositions, respectively and m and n are the number of monolayers of A and B, respectively. The term "composition" is used to mean not only the major constituents of the regions but also any dopants. For example, regions 5 and 7 may comprise GaAs but have different conductivity types.

The periodic steps are expediently formed by misorienting the substrate with respect to a major crystallographic plane. This is done by cutting a wafer that is misoriented and then etching to obtain a stepped surface with the step height being equal to the interatomic spacing. In practice, it may be desirable to grow a buffer layer, not shown, of material identical to the substrate material to remove undesired variations in the surface caused by the etching. The resulting misorientation angle, that is, the angle between the superlattice orientation and the major crystallographic plane, is indicated as $\alpha$.

Two periodicities may be generated by the alternate deposition of m monolayers of A and n monolayers of B where m and n are fractions or integers and may be larger or smaller than 1.0. There is a horizontal periodicity and there may also be a vertical periodicity. A new type of superlattice is thus produced and defined by the unit cell vectors $\vec{OA}$ and $\vec{OB}$. The vectors are defined as $\vec{OA} = (m+n)d/\tan\alpha$ and $\vec{OB} = d/\sin\alpha$, where d is the step height, m and n are the fractions of the step widths covered by the first and second regions, respectively, and $\alpha$ is the misorientation angle. For a (100) GaAs substrate, d=2.83 Angstroms. The fraction of the step width covered is equal to the fraction of a monolayer formed. Both m and n may be greater than 1.0, i.e., a region may be more than one monolayer.

In a particular embodiment, the substrate comprised GaAS and the first and second pluralities of regions comprised $(GaAs)_{0.75}$ and $(AlAs)_{1.25}$, respectively, i.e., m and n equaled 0.75 and 1.25, respectively. The (100) substrate had a misorientation angle, $\alpha$, towards one of the <110> directions.

The superlattices of our invention are conveniently fabricated by molecular beam epitaxy (MBE). The substrates are cut and polished with the desired misorientation angle. This angle is chosen to select the desired step width and is typically between 1 and 5 degrees although, of course, greater and lesser angles may be used. However, for (100) GaAs, misorientation angles within this range result in step widths between 100 and 500 Angstroms. Values within this range are desirable if quantum effects are desired and unwanted carrier tunneling is to be avoided. The step height is equal to the interatomic spacing and is thus not a function of the misorientation angle. However, the spacing between the steps, i.e., the step width, decreases as the misorientation angle increases.

Standard surface preparation procedures are used prior to the epitaxial growth. The epitaxial growth may be performed in a standard high vacuum molecular beam epitaxy growth chamber at temperatures within the range from approximately 510 degrees C. to approximately 610 degrees C. for GaAs and AlAs compositions. However, this is only an approximate range. The precise range is a function of the arsenic total pressure, the ratio of $As_2/As_4$, and the growth rate. Determination of the optimum temperature range will be readily accomplished by those skilled in the art for these materials systems.

The extent of the first and second regions, i.e., the values of m and n, is accurately controlled by, for example, the use of an automatically controlled shutter system which alternately blocks the Ga and Al beams. Adjusting the shutter system, i.e., the times that the beams are permitted to reach the substrate, enables the desired values of m and n to be obtained. It should be again noted that the values of m and n may be either integer or fractional numbers and greater or less than 1.0. The deposited atoms tend to migrate to the step edges so that the stepped surface is preserved during growth as the step edges act as nucleation sites. The growth is dominated by nucleation at step edges and a lateral layer growth mode.

Fabrication of structures using other semiconductors and materials will be readily accomplished by those skilled in the art in view of the preceding discussion.

The presence of thermal kinks along step edges may hinder fabrication of superlattices because there is a higher nucleation probability at the kink sites and the kinks thus tend to control the lateral layer growth. The term "kink" means a lack of uniformity in the step edge. Lateral layer growth along the step edges and on different steps is thus not uniform on an atomic scale and the superlattice appears disordered for extremely small values of (m+n). Better control is, however, possible by using higher substrate temperatures during growth or by making a judicious choice of step edge orientation.

Figure 2:
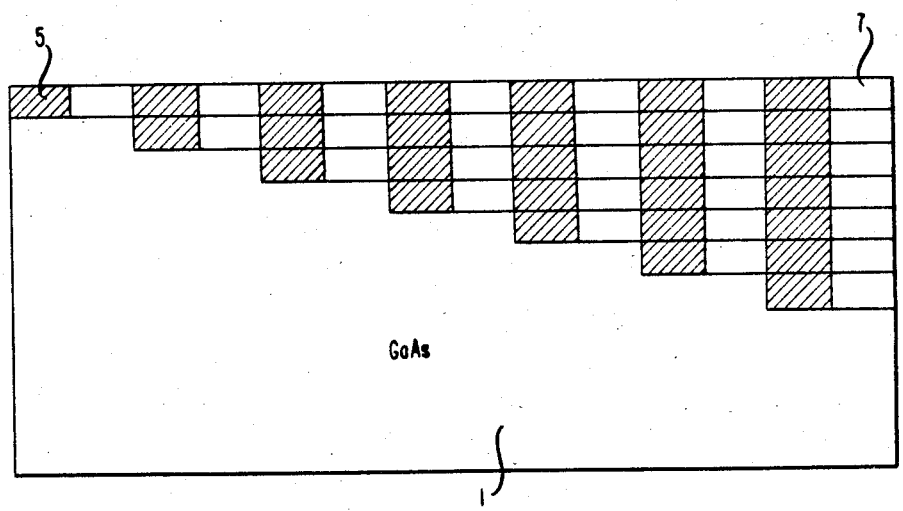
FIG. 2 is a cross-sectional view of another embodiment of our invention.
Figure 3:
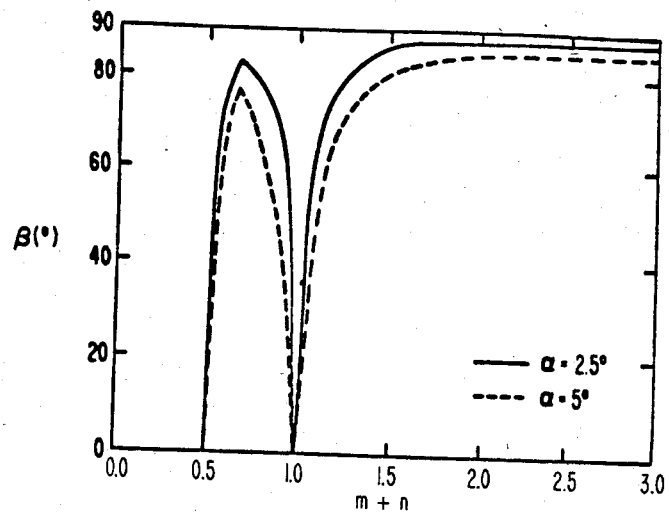
FIG. 3 plots the misorientation angle vertically versus the sum of monolayers horizontally for two substrate misorientation angles.

Numerous other superlattice configurations may be fabricated in accordance with our invention. One such structure is depicted in FIG. 2 where numerals identical to those used in FIG. 1 refer to identical elements. In this embodiment, the superlattice regions comprise the composition $(GaAs)_{0.5}(AlAs)_{0.5}$. That is, the first and second regions comprise $(GaAs)_{0.5}$ and $(AlAs)_{0.5}$, respectively, and both m and n equal 0.5. There is a periodicity perpendicular to the growth front, i.e., parallel to the substrate major surface, in the superlattice with a period, $\lambda = d/\tan \alpha$. It will be readily appreciated that the first and second pluralities of regions form vertical stacks of monolayers. That is, regions of identical composition overlay each other in succeeding monolayers. However, the formation of such stacks may be obtained only for relatively narrow ranges of (m+n) as shown in FIG. 3. In FIG. 3, (m+n) is plotted horizontally versus the angle, $\beta$, between the horizontal superlattice orientation and the substrate normal plotted vertically. The solid line is for a misorientation angle, $\alpha$, of 2.5 degrees and the dotted line is for misorientation angle, $\alpha$, of 5 degrees. For other values of (m+n) and the $\alpha$ values depicted, at least one of the pluralities of regions will overlay regions of the second plurality and not of itself.

Figure 4:
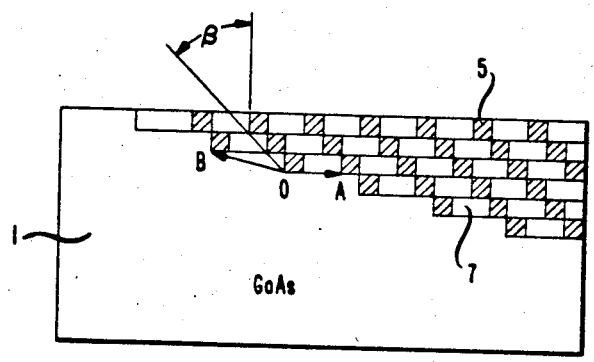
FIG. 4 is a cross-sectional view of yet another embodiment of our invention.

FIG. 4 illustrates yet another submonolayer superlattice according to this invention. In this superlattice structure, the compositions of the regions are $(GaAs)_{0.5}(AlAs)_{0.25}$, i.e., A and B are GaAs and AlAs, respectively, and m and n equal 0.5 and 0.25, respectively. The angle, $\beta$, is also depicted. It should be noted that while the GaAs regions form vertical stacks, the AlAs regions overlay GaAs regions and do not form stacks.

It will be readily appreciated that further structures may be easily fabricated by alternating a horizontal superlattice having a given value of (m+n) with another horizontal superlattice having another value of (m+n). Additionally, the values of m and n may be maintained constant, but the first and second compositions varied. That is, there may be a second horizontal superlattice $(C)_o(D)_p$ disposed on the first superlattice. The same considerations apply to the values of C, D, o and p as to the values of A, B, m, and n. Horizontal superlattices may be interleaved with vertical superlattices. This permits structures such as quantum well wires to be easily fabricated without the need for any lithographic process. Other variations will be readily thought of.

Figure 5:
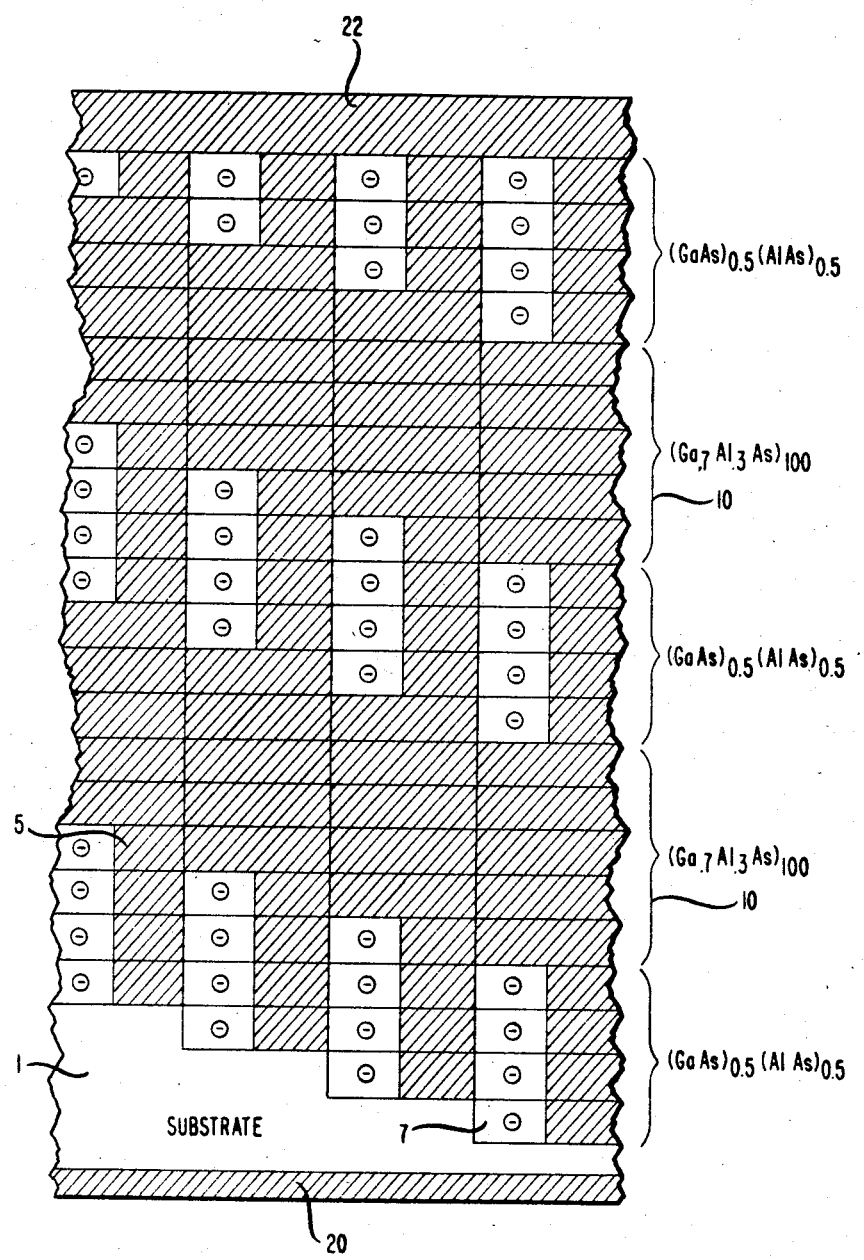
FIG. 5 is a cross-sectional view of still another embodiment of our invention.

One such structure is depicted in FIG. 5. The structure comprises a plurality of stacked $(GaAs)_{0.5}(AlAs)_{0.5}$ horizontal superlattices vertically interleaved with stacked, i.e., vertical $(Ga_{0.7}Al_{0.3}As)_{100}$ structures 10 which are periodic in a direction perpendicular to the stepped substrate surface. Alternatively, structure 10 could comprise $(AlAs)_{100}$ monolayers. There are typically approximately 100 monolayers of the $(GaAs)_{0.5}(AlAs)_{0.5}$ horizontal superlattice as well as of structure 10. For reasons of clarity, a lesser number is depicted. The $(GaAs)_{0.5}$ regions are thus surrounded by regions of larger bandgap material. There is also typically a buffer layer, not shown, of wide bandgap material between the lowermost $(GaAs)_{0.5}$ monolayers and the substrate. Electrical contacts 20 and 22 to the substrate and top layer, respectively, enable the structure to be used as, for example, a negative resistance device and also permit carrier injection when the device is used as a laser.

Interesting device applications arise if at least one of the regions surrounding the $(GaAs)_{0.5}$ regions is doped, for example, n-type. Electrons are confined to the $(GaAs)_{0.5}$ regions in two dimensions and have only a single translational degree of freedom. The structure is thus a quantum well wire provided that the horizontal and vertical dimensions of regions 7 are sufficiently small so that the quantum effects are significant. More generally, the electron energy levels in the undoped regions should be lower than the conduction band energy level of the adjacent regions. Similar considerations apply for p-type conductivity.

Figure 6:
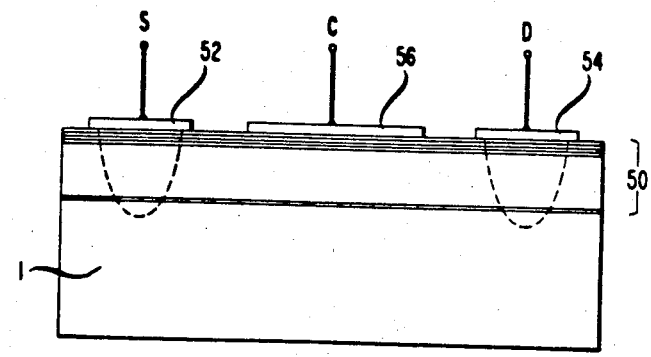
FIG. 6 is a cross-sectional view of another embodiment of our invention.

Other device applications are readily thought of. For example, the periodic variation of composition also results in a periodic variation in refractive index and lends itself to distributed feedback devices. In this embodiment, structure 10 would comprise a low bandgap material, e.g., GaAs, and be surrounded by two wider bandgap regions, e.g., $(Ga_{0.7}Al_{0.3}As)$ and (AlAs) regions, of opposite conductivity type and appropriate period. Structure 10 is thus the active layer. The structure is also useful as an electro-optic modulator or an optically bistable device. Some device applications will use the relatively strong exciton binding energy. The structure is also useful as a one-dimensional (1D) FET (field effect transistor) such as that depicted in FIG. 6. The device comprises a superlattice region 50 such as that depicted in FIG. 5. It has source 52, drain 54 and gate 56 electrodes which control the current flow through the superlattice region. The one-dimensional channels run from the source region to the drain region.

Still other device applications for the other superlattice structures described will be readily thought of for the structures described. For example, the structure depicted in FIG. 2 is useful as a diffraction grating for radiation. As is well known to those skilled in the art, the compositional variation in the AlGaAs system also results in a variation in refractive index. Visible or near infrared radiation typically will only see every tenth perturbation because the step width is typically large compared to the wavelength of radiation in the visible and near infrared region. However, in the x-ray portion of the electromagnetic spectrum, radiation will have wavelengths comparable to the step width, i.e., $\lambda$ is comparable to the step width, and the structure is readily used as a filter for broadband x-ray sources. The structure depicted in FIG. 1 can also function as a diffraction grating. Furthermore, this structure can also function as an optical waveguide with the optical radiation generated in or transmitted through the GaAs monolayers. The structure depicted in FIG. 5 can also function as a waveguide when structure 10 is surrounded by regions of lower refractive index. Although the waveguide has many steps along its walls, it does not scatter light to a large extent because of the small step size. That is, the step size is significantly smaller than the wavelength of the radiation in the visible or near infrared region. It will be readily appreciated by those skilled in the art that this structure depicted is really a double heterostructure waveguide and functions, as previously discussed, as a laser when suitably pumped.

Other device applications will be readily thought of. Those skilled in the art will readily appreciate that although our invention has been particularly described with respect to a horizontal superlattice having two regions interleaved with each other, the horizontal superlattice may comprise three or more regions having different compositions.

Figure 7:
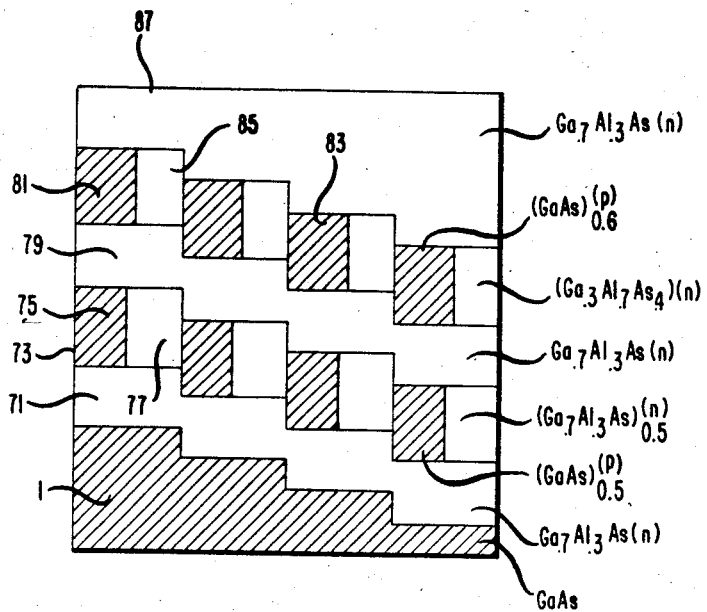
FIG. 7 is a view of a one-dimentional quantum well wire laser.

Quantum well wire lasers emitting at two or more wavelengths may also be fabricated. One such laser which emits at two wavelengths is depicted in FIG. 7. For reasons of clarity, the electrical contacts will be depicted in FIG. 8. The structure comprises GaAs substrate 1, first cladding layer 71 (n-type $Ga_{0.7}Al_{0.3}As$), first active layer 73, second cladding layer 79 (n-type $Ga_{0.7}Al_{0.3}As$), second active layer 81 and third cladding layer 87 (n-type $Ga_{0.7}Al_{0.3}As$). The active layers are typically 200 to 400 Angstroms thick. The first active layer comprises regions 75 and 77 which comprise p-type $(GaAs)_{0.5}$ and n-type $(Ga_{0.7}Al_{0.3}As)_{0.5}$, respectively. The cladding layers are typically 100 monolayers thick. The second drive active layer comprises regions 83 and 85 which comprise p-type $(GaAs)_{0.6}$ and n-type $(Ga_{0.7}Al_{0.3}As)_{0.4}$, respectively. Regions 75 and 83 have conductivity types opposite to those of regions 77 and 85, namely, p- and n-type, respectively. The widths of the GaAs confining regions, i.e., the energy wells, differ in the two active layers, and thus the wavelengths of the emitted radiation from the two active layers will also differ. Alternatively, the widths of the wells could be the same and Al could be added to the GaAs well in one active layer to change the depth of the well. It should be noted that radiation is emitted in a direction perpendicular to the plane of FIG. 7. Implementation of this multi-wavelength laser in other materials systems will be readily apparent to those skilled in the art.

Figure 8:
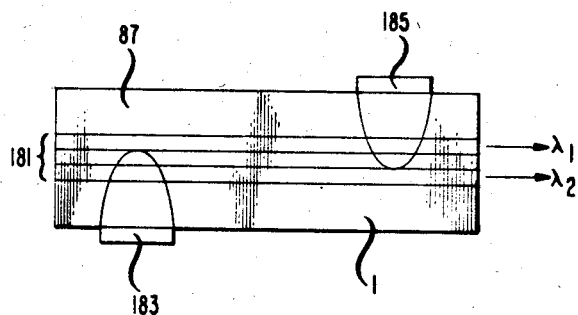
FIG. 8 illustrates the electrical contacts to the laser of FIG. 7.

A scheme for electrically contacting the device of FIG. 7 is depicted in FIG. 8. Depicted are substrate 1, superlattice region 181 and third cladding layer 87. Region 181 includes the active and intermediate cladding layers. The n-type and p-type regions are electrically contacted by contacts 183 and 185, respectively. The contacts are expediently formed by diffusing approximate dopants and metallizing. The emitted radiation is indicated as $\lambda_1$ and $\lambda_2$. Of course, the active layers could have identical compositions and dimensions and emit radiation at the same wavelength.

What is claimed is:

1. A device comprising a substrate having a surface, said surface being misoriented with respect to a major crystallographic plane, said surface having a plurality of steps, said steps having a height and a width and being arranged periodically, a first plurality of regions on a portion of said steps having a first composition, a second plurality of regions having a second composition, said first and said second pluralities being interleaved with each other.

2. A device as recited in claim 1 in which said first and second pluralities form a first horizontal superlattice.

3. A device as recited in claim 2 in which the first and second compositions of said first and second pluralities comprise $(A)_n$ and $(B)_m$, respectively, and n and m are the fractions of said width covered by said first and second compositions, respectively, n and m both being greater than 0.0.

4. A device recited in claim 3 in which A and B comprise semiconductors.

5. A device as recited in claim 4 in which said semiconductors are selected from the group consisting of Group III-V compound semiconductors.

6. A device as recited in claim 5 in which (n+m) is equal to an integer.

7. A device as recited in claim 3 further comprising a third plurality of regions having a third composition and a fourth plurality of regions having a fourth composition, said third and fourth pluralities being interleaved with each other on said first horizontal superlattice and forming a second horizontal superlattice.

8. A device as recited in claim 7 in which said third and fourth compositions comprise $(C)_o$ and $(D)_p$, respectively, and o and p are the fractions of said width covered by said third and fourth compositions, respectively.

9. A device as recited in claim 8 in which C and D comprise semiconductors.

10. A device as recited in claim 9 in which said semiconductors are selected from the group consisting of Group III-V compound semiconductors.

11. A device as recited in claim 8 further comprising a third horizontal superlattice on said second horizontal superlattice.

12. A device as recited in claim 4 further comprising a first semiconductor layer on said horizontal superlattice.

13. A device as recited in claim 12 in which said first plurality of regions has a bandgap less than the bandgaps of adjacent semiconductor regions.

14. A device as recited in claim 12 in which said first plurality of less heavily doped than said second plurality.

15. A device as recited in claim 12 further comprising first and second electrical contacts to said device.

16. A device as recited in claim 15 further comprising a third electrical contact to said device, said third contact being between said first and second contacts.

17. A device as recited in claim 15 in which said surface and said semiconductor layer have opposite conductivity types.

18. A device as recited in claim 16 further comprising a second horizontal superlattice comprising third and fourth pluralities of regions interleaved with each other and a second semiconductor layer, said second horizontal superlattice and semiconductor layers being between said first horizontal superlattice and said semiconductor layer and said second horizontal superlattice being nearest said first semiconductor layer.

19. A device as recited in claim 18 in which said first and third pluralities have a conductivity type opposite to that of said second and fourth pluralities.

20. A device as recited in claim 2 comprising a semiconductor layer and an active layer between said semiconductor layer and said horizontal superlattice, said surface and said semiconductor layer having opposite conductivity types, said active layer having a bandgap less than the bandgaps of adjacent regions.

21. A device as recited in claim 20 further comprising first and second electrical contacts to said device.

22. A device as recited in claim 21 in which said first and second pluralities have different refractive indices.

* * * * *

UNITED STATES PATENT AND TRADEMARK OFFICE
CERTIFICATE OF CORRECTION

PATENT NO. : 4,591,889
DATED : May 27, 1986
INVENTOR(S) : Arthur C. Gossard, Pierre M. Petroff It is certified that error appears in the above-identified patent and that said Letters Patent is hereby corrected as shown below:

Column 3, line 8, "and" should read --or--.
Column 7, line 23, delete "drive".
Column 8, line 36, "of" should read --is--.

Signed and Sealed this

Thirtieth Day of September 1986

[SEAL]

Attest:

DONALD J. QUIGG

Attesting Officer

Commissioner of Patents and Trademarks